(12) United States Patent
Cheah et al.

(10) Patent No.: US 6,898,750 B2
(45) Date of Patent: May 24, 2005

(54) IN-CHIP MONITORING SYSTEM TO MONITOR INPUT/OUTPUT OF FUNCTIONAL BLOCKS

(75) Inventors: Jonathon Cheah, San Diego, CA (US); Chee Kwang Quek, San Diego, CA (US); Ee Hong Kwek, San Diego, CA (US)

(73) Assignee: Microtune (San Diego), Inc., San Diego, CA (US)

( * ) Notice: Subject to any disclaimer, the term of this patent is extended or adjusted under 35 U.S.C. 154(b) by 424 days.

(21) Appl. No.: 10/052,063

(22) Filed: Jan. 16, 2002

(65) Prior Publication Data

US 2003/0135804 A1 Jul. 17, 2003

(51) Int. Cl.[7] .................................................. G06F 11/00
(52) U.S. Cl. ......................................................... 714/738
(58) Field of Search ................................. 714/738, 724, 714/726, 727, 728, 733, 734, 739, 30, 31

(56) References Cited

U.S. PATENT DOCUMENTS

| 4,947,357 A | | 8/1990 | Stewart et al. ............. 371/22.3 |
| 5,115,437 A | * | 5/1992 | Welles, II et al. ........... 714/733 |
| 5,734,661 A | * | 3/1998 | Roberts et al. ............. 714/733 |
| 5,774,475 A | | 6/1998 | Qureshi .................... 371/22.31 |

FOREIGN PATENT DOCUMENTS

| EP | 0 639 006 A1 | 2/1995 | ......... H03K/19/173 |
| WO | WO 01/33238 A1 | 5/2001 | ....... G01R/31/3185 |

* cited by examiner

Primary Examiner—Christine T. Tu
(74) Attorney, Agent, or Firm—Baker Botts L.L.P.

(57) ABSTRACT

An in-chip monitoring method and apparatus are disclosed. In one embodiment the apparatus includes a test pad, a transmission gate and a plurality of test components coupled to the transmission gate. The transmission gate is attached to a substrate and adapted to receive a code word uniquely addressed to one of the plurality of test components. In a further embodiment, the transmission gate is further adapted to relay an output of the one of the plurality of test components to the test pad, in response to receipt of the code word.

19 Claims, 6 Drawing Sheets

IN-CHIP MONITORING SYSTEM TO MONITOR INPUT/OUTPUT OF FUNCTIONAL BLOCKS

FIELD OF THE INVENTION

The field of the invention relates to electronic and digital devices generally, and more particularly to an on-chip monitoring system to monitor an input/output of functional blocks.

BACKGROUND OF THE INVENTION

Included within the design of electronic chips and transceivers are a number of functional blocks. A functional block is a predetermined portion of the circuit having a surface area less than the total surface area of the circuit. A functional block includes one or more of the circuit's electrical components and may or may not be physically identifiable from a visual inspection of the manufactured circuit. Thus, the perimeter of a functional block may be identified by a grid superimposed on a circuit diagram, or may be identified by physical characteristics of the manufactured circuit. Physical characteristics may include grid lines painted or formed on the manufactured circuit, as well as electrical components that are different colors.

Figure 1:
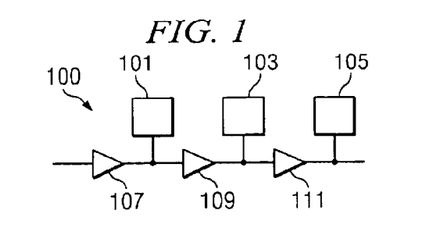
FIG. 1 is a diagram illustrating the use of a plurality of test pads to monitor and test a corresponding plurality of electrical components.

Generally, each functional block contains a plurality of test pads that are connected to a corresponding plurality of the block's internal electrical components. For example, as shown in FIG. 1, a plurality of test pads 101, 103 and 105 are coupled to a corresponding plurality of electrical components 107, 109, and 111 that are included within functional block 100.

A disadvantage of this approach is that the input and output of the functional block as a whole cannot be easily measured using a single test pad associated with the functional block. Instead, the functionality of each electrical component within the functional block has to be tested either by using the plurality of test pads or by breaking out individual lines. A further disadvantage is that associating multiple test pads within each functional block consumes the chip's valuable surface area. Yet another disadvantage is that the approaches outlined above do not offer an apparatus or a method of testing or monitoring the input and output of a functional block, or individual components thereof, using a single test pad associated with that functional block.

SUMMARY OF INVENTION

An in-chip monitoring method and apparatus are disclosed. In one embodiment the apparatus includes a test pad, a transmission gate and a plurality of test components coupled to the transmission gate. The transmission gate is attached to a substrate and adapted to receive a code word uniquely addressed to one of the plurality of test components. In a further embodiment the transmission gate is further adapted to relay an output of the one of the plurality of test components to the test pad, in response to receipt of the code word.

BRIEF DESCRIPTION OF THE DRAWINGS

Various aspects of the present invention are set forth by way of example, and not limitation, in the figures of the accompanying drawings, in which.

DETAILED DESCRIPTION

A method and an apparatus for on-chip monitoring system to monitor an input/output of functional blocks is disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order not to unnecessarily obscure the present invention.

Reference is made to the accompanying drawings in which like references indicate similar elements, and in which is shown by way of illustration, specific embodiments in which the invention may be practiced. These embodiments are described in sufficient detail to enable those skilled in the art to practice the invention. The following detailed description is, therefore, not to be taken in a limiting sense, and the scope of the invention is defined only by the appended claims.

Unless specifically stated otherwise, as apparent from the following discussions, it is appreciated that throughout the detailed description discussions utilizing terms such as "processing," "computing," "calculating," "determining," or the like, refer to the action and/or processes of a computer or computing system, or similar electronic computing device. Such a device manipulates and/or transforms data represented as physical, such as electronic quantities within the computing system's registers and/or memories into other data similarly represented as physical quantities within the computing system's memories, registers or other such information storage, transmission or display devices.

The present invention may be provided as a computer program product, or software, that may include a machine-readable medium having stored thereon instructions, which may be used to program a computer system (or other electronic devices) to perform a process according to the present invention. The machine-readable medium may include, but is not limited to, any type of disk including floppy disks, optical disk, CD-ROMs, and magnetic-optical disks. The machine-readable medium may also include, but is not limited to, read-only memories (ROMs), random access memories (RAMs), electrically programmable read only memories (EEPROMs), magnetic or optical cards, or any other type of media suitable for storing electronic instructions, and capable of being coupled to a system bus for a computing device.

Electrical circuits may be divided into two or more functional blocks for testing or monitoring (hereinafter, testing). Purposes of testing the circuit include, but are not limited to, verifying the circuit's operational status and debugging the circuit. In one embodiment, the use of functional blocks facilitates verification and debugging operations by allowing particular regions of the circuit to be tested (and repaired) independently of each other. For example, portions of a particular functional block may be independently tested from other portions of the functional block. Alternatively, a particular functional block may be tested independently of other functional blocks comprising the circuit.

Figure 2:
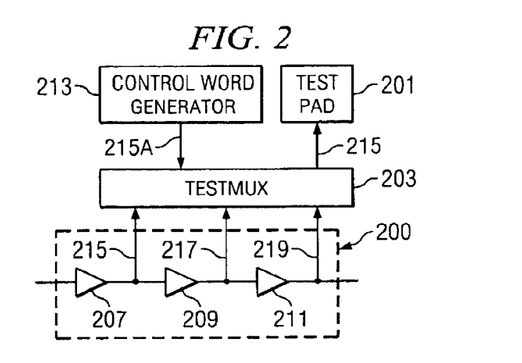
FIG. 2 is a diagram illustrating the use of a single test pad to monitor and test multiple electrical components within a functional block, according to one embodiment of the invention.

FIG. 2 is a diagram illustrating the use of a single test pad to monitor and test multiple electrical components 207, 209 and 211 within a functional block 200, according to one embodiment of the invention. In contrast to the multiple test pads 101, 103 and 105 associated with the prior art apparatus shown in FIG. 1, only a single test pad 201 is associated with the functional block 200 shown in FIG. 2. Test pad 201 is operatively coupled to a transmission gate 203, which, in one embodiment, may be a test multiplexer (referenced in the drawings as testmux). The multiplexer may be of a type known to persons of ordinary skill in the arts.

As shown in FIG. 2, multiple electrical components 207, 209 and 211 are each operatively coupled to a transmission gate 203. A code word generator 213 may be directly coupled to the transmission gate 203, as illustratively shown in FIG. 2. Alternatively, the code word generator 213 may be indirectly coupled to the transmission gate 203 via test pad 201. In one embodiment the code word generator is a computer.

In operation, each of electrical components 207, 209, and 211 receive input, and generate outputs 215, 217 and 219, respectively. The transmission gate 203 receives one or more of the outputs 215, 217 and 219, and buffers them until a code word is received from code word generator 213. Illustratively a code word is a four bit digital word that is uniquely addressed to a particular electrical component. Note, however, that other bit lengths may also be used. Upon receipt of a code word from the code word generator 213, transmission gate 203 outputs the signal originating from the electrical component that is uniquely associated with the code word. This signal is outputted to test pad 201. Receipt of a second code word causes transmission gate 203 to output a second signal originating from a second electrical component that is uniquely associated with the second code word. This process of receiving code words and outputting signals corresponding thereto may be repeated for as many times as necessary.

In one embodiment, the code words are automatically generated by a computer 213, and automatically transmitted thereby to the transmission gate 203. The generation and transmission of the code words may be accomplished according to instructions embodied in a machine-readable medium that is associated with the computer 213. In this manner a circuit may be automatically tested or monitored using a single test point 201.

In one embodiment, computer 213 is an external computer, operatively coupled to the circuit being tested that resides beyond the substrate containing the circuit. Alternatively, the computer 213 is an internal computer operatively coupled to the circuit being tested. The internal computer may reside on the substrate containing the circuit.

In one embodiment, operatively coupling test pad 201, code word generator 213, transmission gate 203 and electrical components 207, 209 and 211 together, as described above, provide a monitoring system within a chip. Such a configuration also provides a circuit implementation that uses computer controls to reroute the output signals of electrical components 207, 209 and 211 away from an outside functional block 200 to test pad 201. The placement of multiplexers and transmission gates, as shown in FIGS. 2–5, allow a chip's functionality to be extracted externally while the chip is functioning. Alternatively, the function of the chip may be interrupted for debugging, testing, or monitoring purposes.

Figure 3A:
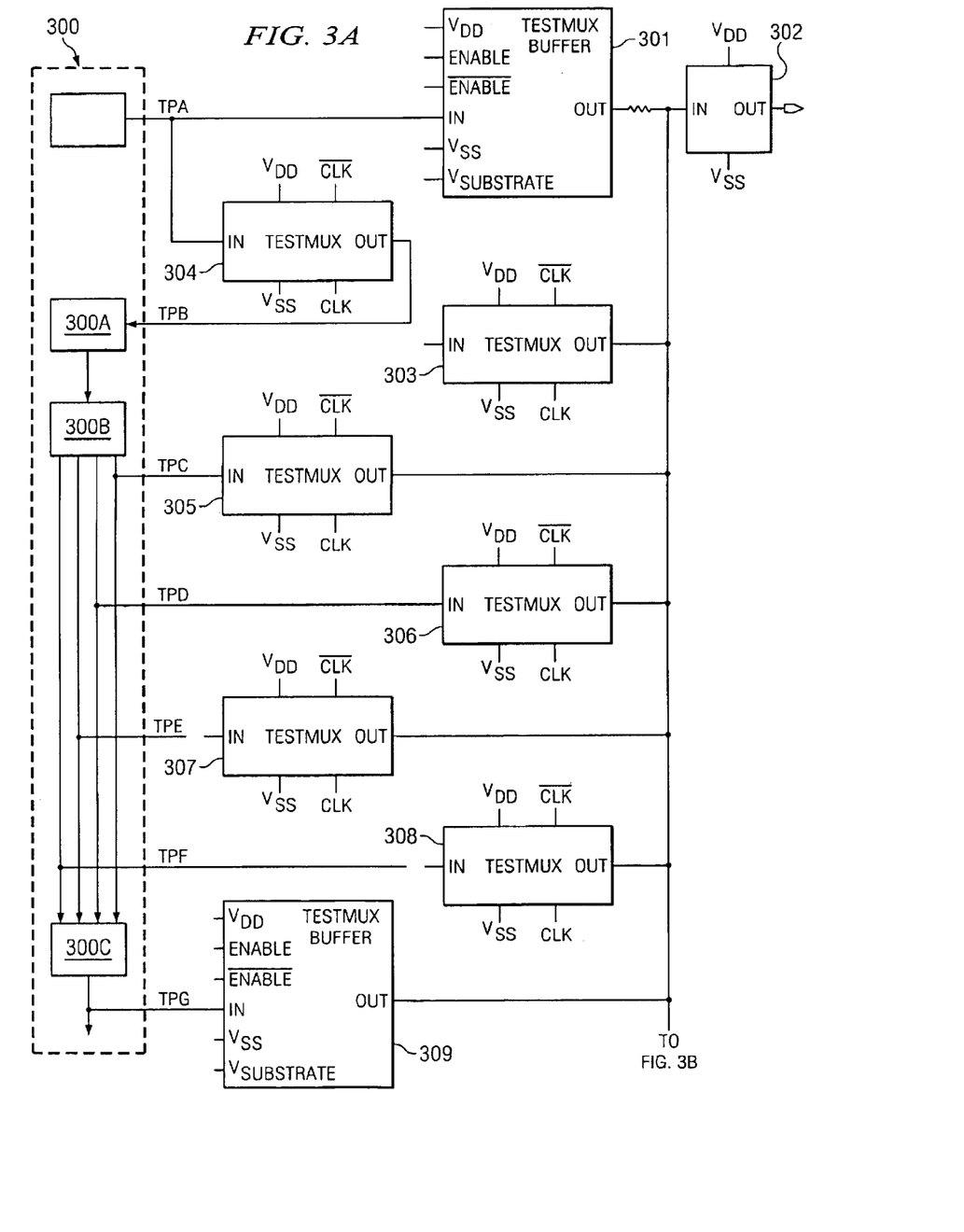
FIGS. 3A and 3B are sections of a circuit diagram illustrating how a single test pad may be associated with a corresponding functional block to test and monitor multiple electrical components within the functional block.
Figure 3B:
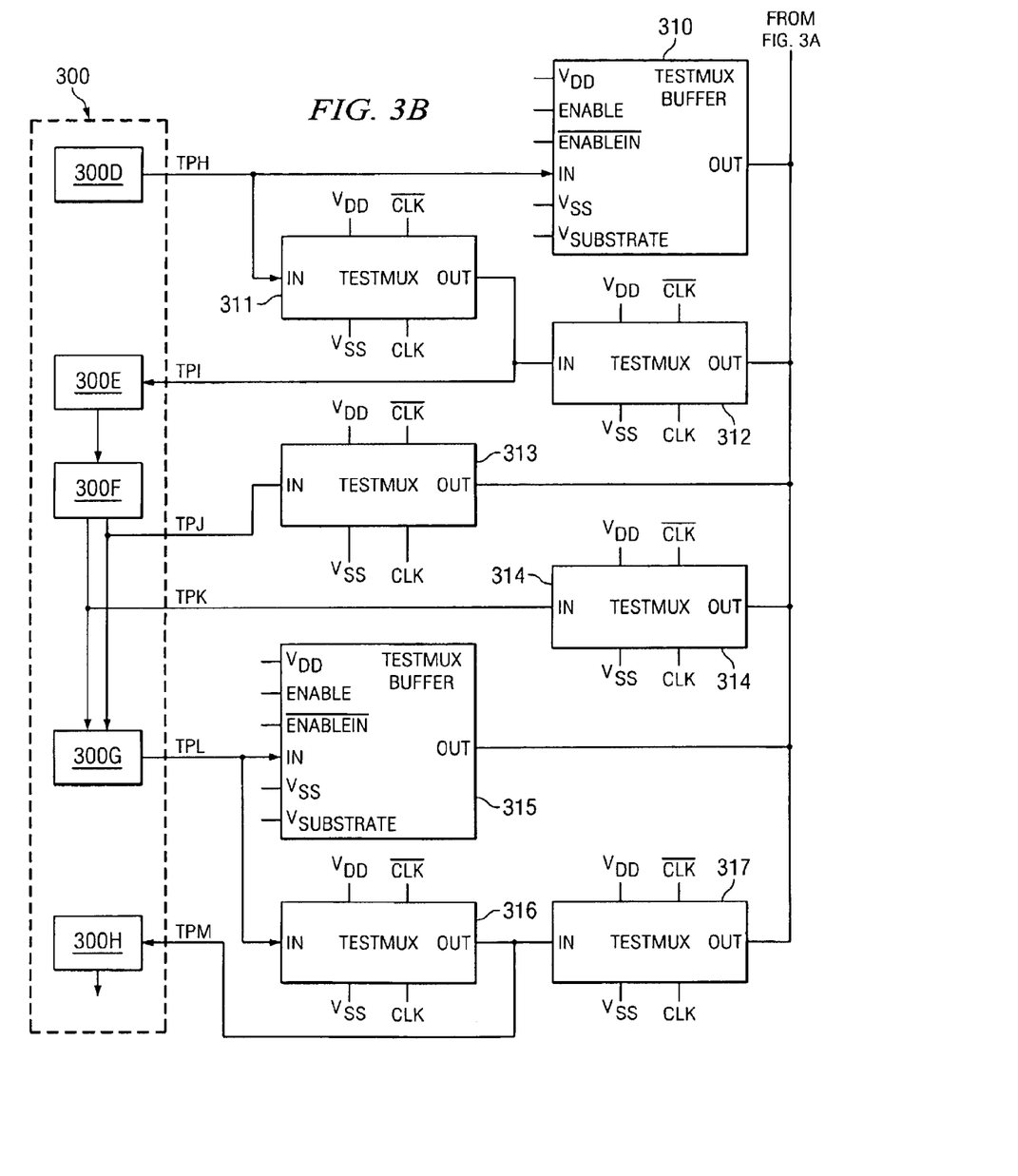

Referring now to FIGS. 3A and 3B, there is shown a diagram of a functional block 300. In FIGS. 3A–3B, the abbreviation TP means test point. Separate test points are labeled TPA-TPM. As shown in FIG. 3A, a single test pad 302 is operatively coupled to transmission gates 301, 303–309, which form part of functional block 300. Additionally, as shown in FIG. 3B, test pad 302 is further operatively coupled to transmission gates 310–317. Each of the transmission gates 301, 303–317 are linked to one or more electrical components, 300A–300G. For example, transmission gates 305–308 route the outputs TPC-TPF respectively of electrical component 300B, to test pad 302 upon receipt of code words that are respectively addressed to switch the transmission gates 305–308 to the state of desired operation. Similarly, transmission gate 310 routes the output of electrical component 300D to test pad 302 and, at the same time, routes it to the input of electrical component 300E via TPH, transmission gate 311 and TPI upon receipt of code words that are respectively addressed to switch the transmission gates 310–312 to the state of desired operation. Test pad 302 can also be used for inputting a signal into electrical component 300E by applying a unique code word to switch off transmission gates 310 and 311 and switch on transmission gate 312, thereby achieving the desired state of operation. In like manner transmission gate 315 routes the output of electrical component 300G to test pad 302 and, at the same time, routes it to the input of electrical component 300H via TPL, transmission gate 316 and TPM upon receipt of code words that are uniquely addressed to switch the transmission gates 315–316 to the state of desired operation. Test pad 302 can also be used for inputting a signal into electrical component 300H by applying a unique code word to switch off transmission gates 315 and 316 and switch on transmission gate 317, thereby achieving the desired state of operation. In one embodiment, functional block 300 may include a logic block (not shown), which determines which of the transmission gates 301, 303–317 are to be turned on or off. In one embodiment, the four-bit code word is programmed into the logic block.

In one embodiment, a signal analyzer (not shown) may be operatively coupled to test pad 302 to receive and analyze the signal outputted from the one of the plurality of test components. In one embodiment, the signal analyzer is a computer.

Figure 4A:
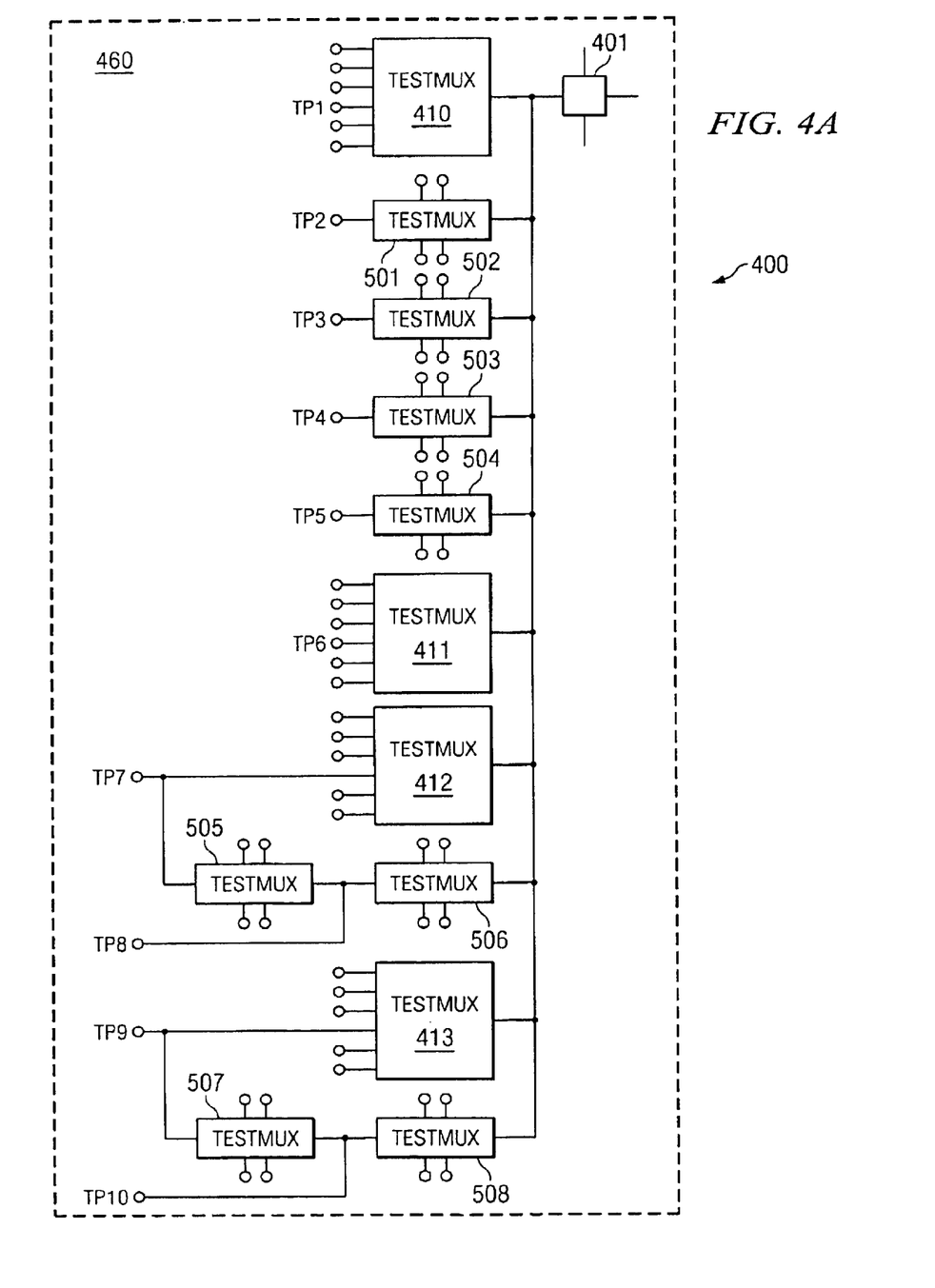
FIGS. 4A—4C (referred to collectively as "FIG. 4") illustrate a diagram showing the configuration of multiple functional blocks within a circuit, according to one embodiment of the invention.
Figure 4B:
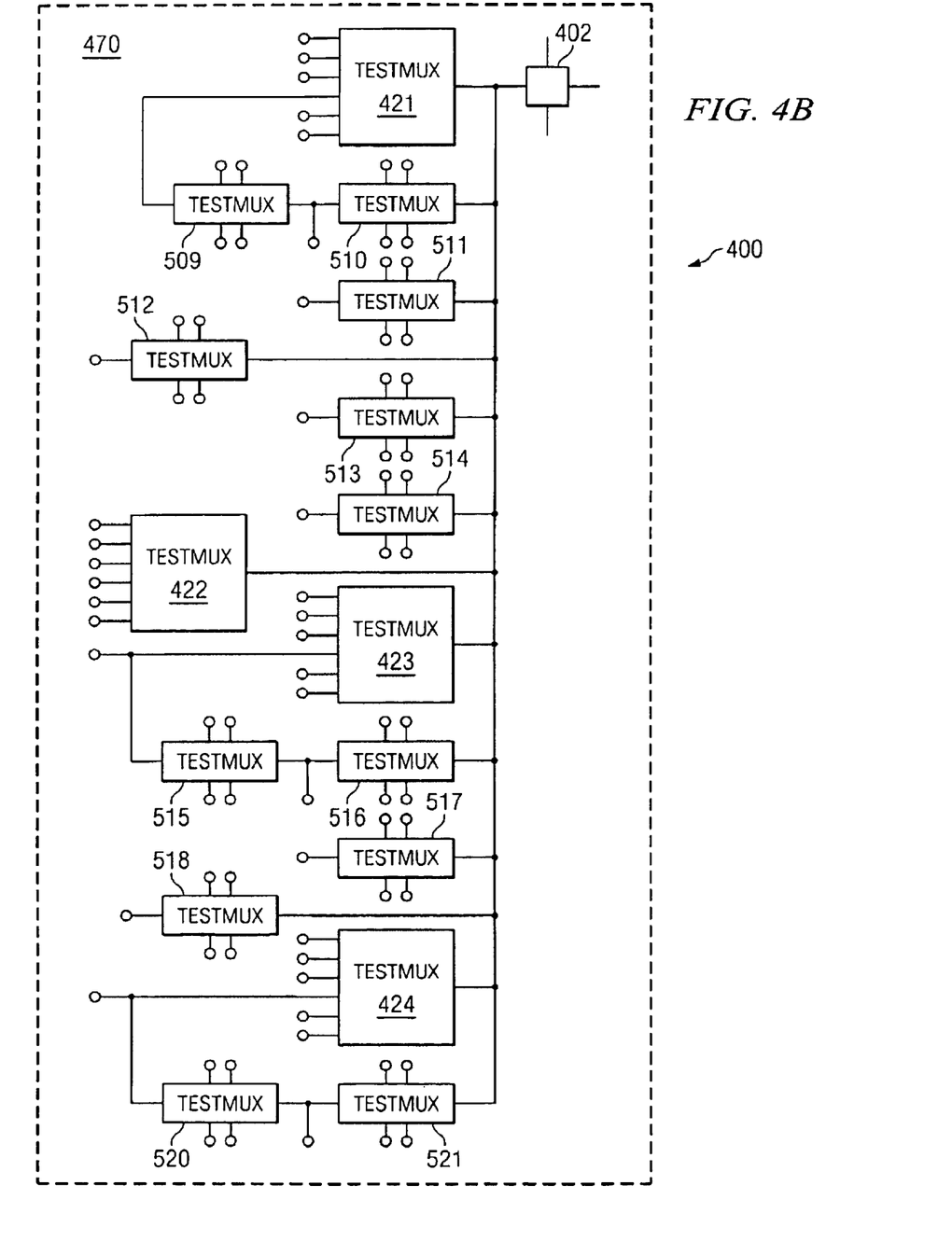
Figure 4C:
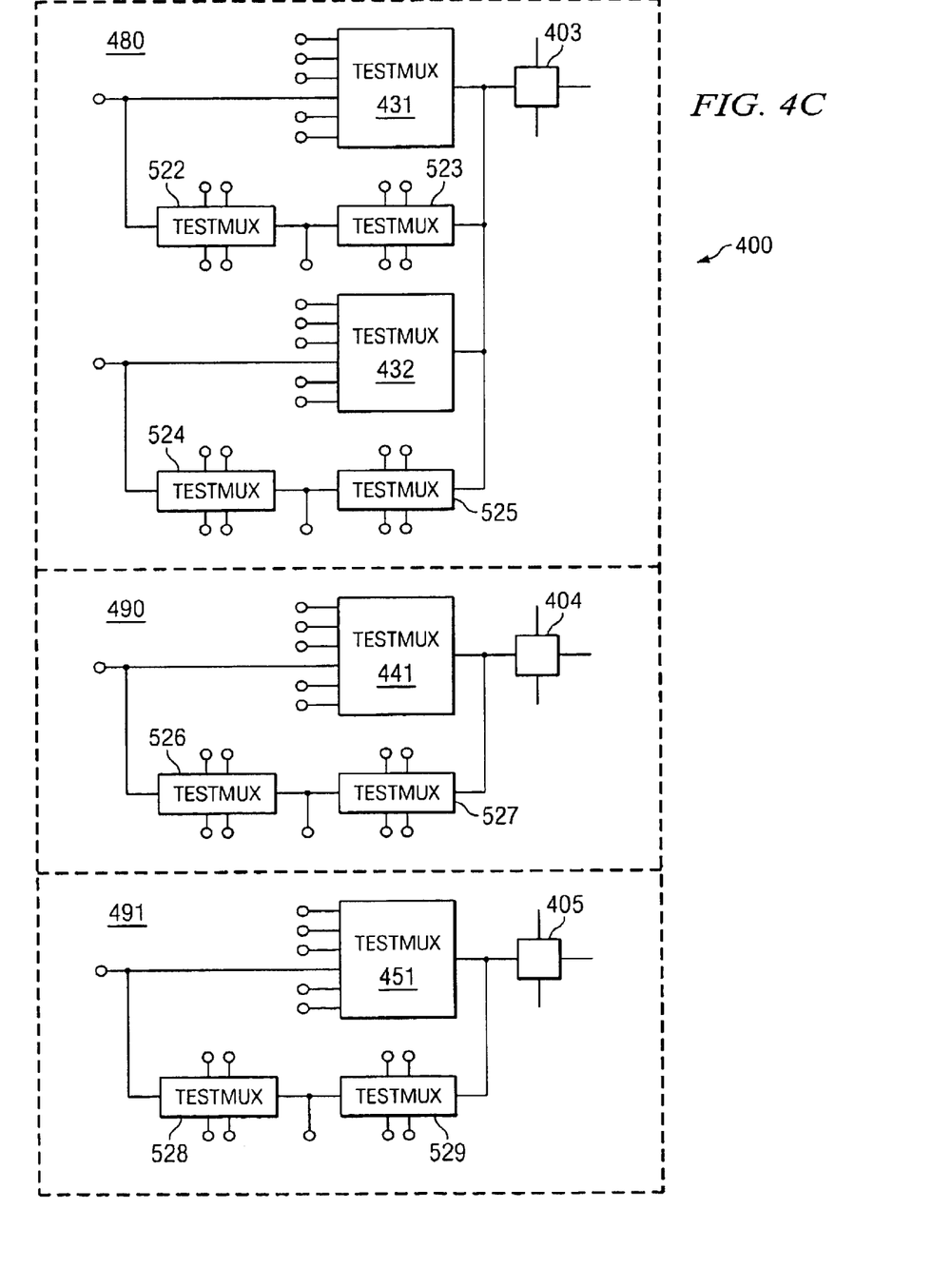

Referring now to FIG. 4, there is shown a diagram of a circuit 400, which includes functional blocks 460, 470, 480, 490 and 491. Embedded in the functional blocks of 460, 470, 480, 490, 491 is the test and monitoring system formed by the interconnections of testmux 410–413, 421–424, 431–432, 441, 451 and 501–512. A code word generator (not shown) is coupled to each of functional blocks 460, 470, 480, 490, and 491. Alternatively a separate code word generator may be operatively coupled to each of functional blocks 460, 470, 480, 490, and 491. As described above, the code word generator generates and transmits a four-bit code word that is uniquely addressed to an electrical component included within one of functional blocks 460, 470, 480, 490 and 491. Receipt of the code word in a logic block (not shown) determines which transmission gates 410, 411, 412, 413, 421, 422, 423, 424, 431, 432, 441, 451 and 501–529 are turned on or off such that the signal outputted by the targeted electrical component is routed to one of test pads 401, 402, 403, 404 or 405.

Illustratively, functional block 460 is associated with test pad 401, and test pad 401 is operatively coupled to transmission gates 410, 411, 412, 413 and 501–508. Functional block 470 is associated with test pad 402, which is operatively coupled to transmission gates 421, 422, 423, 424 and 509–521. Similarly, functional block 480 is associated with test pad 403, which is operatively coupled to transmission gates 431, 432 and 522–525. Functional block 490 is associated to the test pad 404, which is operatively coupled to transmission gate 441 and 526–527. Similarly, functional block 491 is operatively coupled to test pad 405, which is operatively coupled to transmission gate 451 and 528–529. Though not shown, a logic block may be included within the circuit 400 to control the desired operation of the test and monitoring system.

The circuits shown in FIGS. 2–4 may be formed on a surface of a substrate. In one embodiment, the test pad associated with each functional block is located on the same surface of the substrate as the circuit being tested. Alternatively, the test pad may be located on a different surface of the substrate or located off of the substrate altogether. In an embodiment where the test pad is not located on the substrate containing the circuit, the substrate containing the circuit may contain a connection port that is linked to the transmission gates included within a functional block. The test pad in this illustrative embodiment may be operatively coupled with a connection port that is linked to the transmission gates, which are included within the functional block. The test pad, in this illustrative embodiment, may operatively couple with the connection port to manage input/output to and from the transmission gates linked to the connection port.

Figure 5:
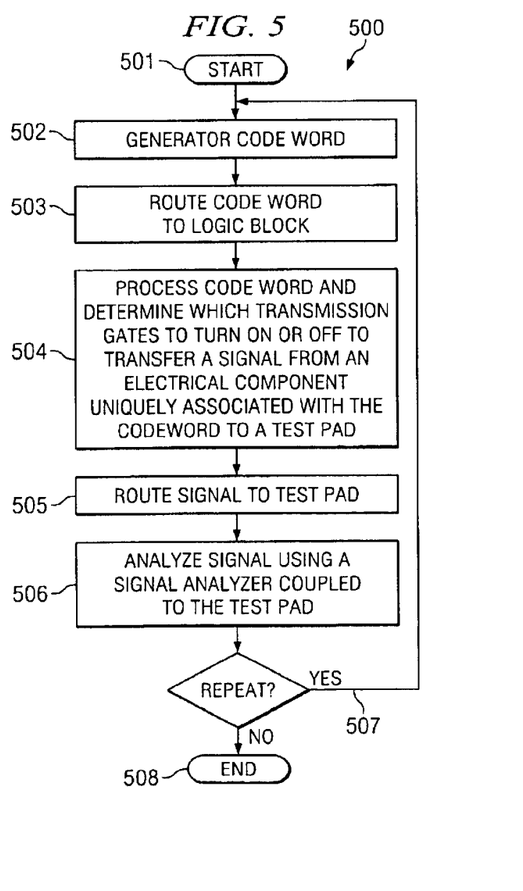
FIG. 5 is one embodiment usable with the present invention.

FIG. 5 is a flow chart illustrating one embodiment of a method usable with the present invention. Method 500 begins at step 501. A code word is generated, step 502, and routed to a logic block, step 503. The code word is uniquely addressed to a particular electrical component included within an electrical circuit. The logic block determines which transmission gates to turn on and off in order to send a signal outputted by the electrical component to which the code word is uniquely associated to a test pad, step 504. The signal is then routed to the test pad, step 505. A signal analyzer operatively coupled to the test pad receives and analyzes the signal, step 506. In one embodiment, method 500 is repeated, step 507, as many times as necessary. In repeating the method, the same or different code word may be generated. When testing or monitoring is complete, the method ends, step 508.

Figure 6:
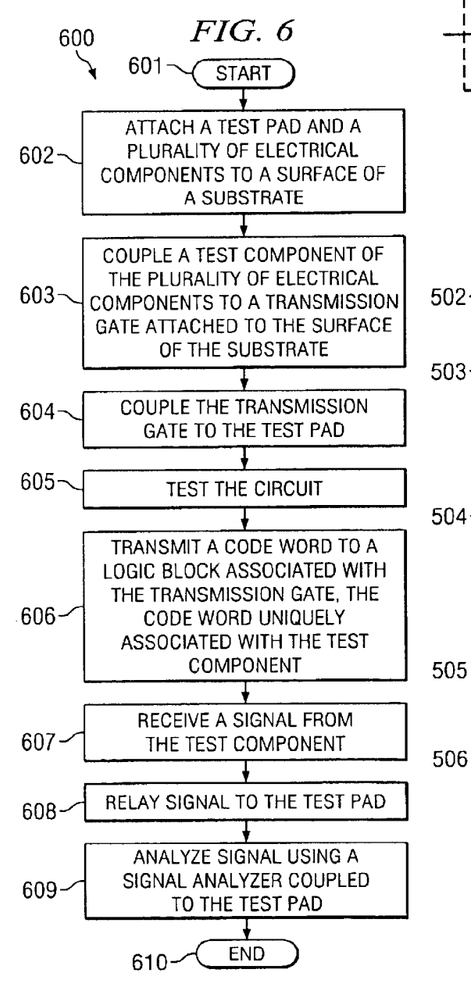
FIG. 6 is another embodiment of a method usable with the present invention.

FIG. 6 is a flow chart illustrating one embodiment of a method useable with the present invention. Method 600 begins at step 601. A plurality of test pads and a larger plurality of electrical components is attached to a surface of a substrate, step 602. The plurality of electrical components may include one or more test components. One or more test components are coupled to a transmission gate attached to the surface of a substrate, step 603. The transmission gate is coupled to one of the test pads, step 604. The circuit is tested, step 605, by transmitting to a logic block associated with the transmission gate a code word, step 606. The code word is uniquely associated with one of the two or more of the plurality of test components. A signal is received from one of the two or more of the plurality test components, step 607, and relayed to the test pad, step 608. The signal is analyzed, step 609, by a signal analyzer coupled to the test pad. In one embodiment, the signal analyzer is a computer. Method 600 ends at step 610.

As used herein, the terms test component and targeted component mean an electrical component that has been selected for testing or monitoring and for which a code word is to be generated.

Thus, a method and apparatus for an in-chip monitoring system to monitor an input/output of functional blocks is disclosed. Although the present invention is described herein with reference to a particular embodiment, many modifications and variations therein will readily occur to those with ordinary skill in the art. Accordingly, all such variations and modifications are included within the intended scope of the present invention as defined by the following claims.

What is claimed is:

1. An in-chip monitoring apparatus, comprising:
    a test pad;
    a transmission gate attached to a surface of a substrate and coupled to the test pad;
    a plurality of electrical components attached to the surface of the substrate, wherein the plurality of electrical components includes a plurality of test components coupled to the transmission gate; and
    a logic block operatively coupled to the transmission gate, the logic block operable to receive a code word uniquely associated with one of the plurality of test components and to control operation of the transmission gate in order to route, based on the code word, a signal outputted by the one of the plurality of test components to the test pad.

2. An apparatus as in claim 1, wherein the transmission gate is a multiplexer.

3. An apparatus as in claim 1, wherein the code word has a variable bit length.

4. An apparatus as in claim 1, wherein the code word has a bit length of four bits.

5. An apparatus as in claim 1, further comprising:
    a code word generator to automatically generate a plurality of code words and to automatically transmit each of the plurality of code words separately to the logic block.

6. An apparatus as in claim 5, wherein the code word generator is a computer.

7. An apparatus as in claim 5, wherein the code word generator is incorporated as one of the plurality of electrical components on the substrate.

8. An apparatus as in claim 1, further comprising:
    a computer coupled to the test pad the computer to process and analyze signals received from the one of the plurality of test components.

9. An apparatus as in claim 1, wherein the test pad is attached to the surface of the substrate and wherein a plurality of electrical components are attached to the surface of the substrate.

10. An apparatus as in claim 1, wherein the test pad is operatively coupled to a connector attached to the substrate and wherein the test pad is operatively coupled to the transmission gate.

11. A method, comprising:
    generating a first code word of variable bit length;
    uniquely associating the first code word with one of a plurality of test components that are included within a plurality of electrical components; and transmitting the first code word to a first transmission gate that is operatively coupled with the at least one of the plurality of the test components.

12. A method as in claim 11, wherein the step of uniquely associating the first code word with one of the plurality of the test components further comprises:

addressing the code word to the one of the plurality of test components.

13. A method of on-chip monitoring, the method comprising:

attaching a plurality of electrical components to a surface of a substrate;

connecting the plurality of electrical components with each other, the plurality of electrical components including a lesser plurality of test components;

attaching a plurality of test pads to the surface of the substrate, wherein the plurality of test pads is less than the plurality of test components;

coupling two or more of the plurality of test components to a transmission gate attached to the surface of the substrate;

coupling the transmission gate to one of the test pads; and transmitting to the transmission gate a code word, the code word being uniquely associated with one of the two or more of the plurality of test components coupled to the transmission gate.

14. A method as in claim 13, comprising:

testing one of the plurality of test components.

15. A method as in claim 14, wherein the step of testing one of the plurality of test components further comprises:

receiving a signal from the one of the two or more of the plurality of test components; and analyzing the signals.

16. A method of in-chip monitoring, comprising:

attaching a plurality of test pads to the surface of a substrate, wherein plurality of test pads is less than a plurality of test components included within a plurality of electrical components attached to the surface of the substrate;

coupling two or more of the plurality of test components to a transmission gate attached to the surface of the substrate;

coupling the transmission gate to a one of the test pads; and transmitting to the transmission gate a code word uniquely associated with one of the two or more test components coupled to the transmission gate.

17. A method as in claim 16, further comprising:

testing one of the plurality of test components.

18. A method as in claim 16, further comprising:

monitoring one of the plurality of test components.

19. A method as in claim 17, wherein the step of testing one of the plurality of test components further comprises:

receiving a signal from the one of the two or more of the plurality of the test components; and analyzing the signal.

* * * * *